(12) United States Patent
Li (10) Patent No.: US 11,287,750 B1
(45) Date of Patent: Mar. 29, 2022

(54) LITHOGRAPHIC APPARATUS

(71) Applicant: CHANGXIN MEMORY TECHNOLOGIES, INC., Hefei (CN)

(72) Inventor: Shuping Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/445,344

(22) Filed: Aug. 18, 2021

Related U.S. Application Data

(63) Continuation of application No. PCT/CN2021/100983, filed on Jun. 18, 2021.

(30) Foreign Application Priority Data

Sep. 28, 2020 (CN) .......................... 202011045204.9

(51) Int. Cl.
*G03F 7/20* (2006.01)

(52) U.S. Cl.
CPC ...... *G03F 7/70741* (2013.01); *G03F 7/70716* (2013.01); *G03F 7/70758* (2013.01); *G03F 7/70916* (2013.01)

(58) Field of Classification Search
CPC ............. G03F 7/70741; G03F 7/70716; G03F 7/70758; G03F 7/70916
See application file for complete search history.

(56) References Cited

U.S. PATENT DOCUMENTS

2021/0191283 A1\* 6/2021 Lee ................... H01L 21/67155
2021/0356857 A1\* 11/2021 Liu ............................ G03F 1/66

FOREIGN PATENT DOCUMENTS

| CN | 106094443 B | 12/2017 |
|---|---|---|
| CN | 108121173 A | 6/2018 |

\* cited by examiner

*Primary Examiner* — Hung Nguyen
(74) *Attorney, Agent, or Firm* — Syncoda LLC; Feng Ma (57) ABSTRACT

A lithographic apparatus includes a machine table, a base, a placement table, a first baffle plate, a first driving device, and a transporting device. The machine table has a cavity formed by a side surface, a top surface, and a bottom surface. A conveying door is arranged on the side surface. A transferring device in the cavity can extend out from or retract back into the cavity through the conveying door. The placement table is configured to bear a mask carrier, and can at least extend out from or retract back to a bearing surface of the base. The first driving device is configured to drive the placement table to reciprocate between a first position and a second position.

16 Claims, 10 Drawing Sheets

LITHOGRAPHIC APPARATUS

CROSS-REFERENCE TO RELATED APPLICATIONS

This is a continuation of International Patent Application No. PCT/CN2021/100983 filed on Jun. 18, 2021, which claims priority to Chinese Patent Application No. 202011045204.9 filed on Sep. 28, 2020. The disclosures of these applications are hereby incorporated by reference in their entireties.

BACKGROUND

During processing of semiconductors, images on masks need to be copied onto wafers by using a lithographic process, so as to form processing images on the wafers. Masks are mounted in a mask carrier, so it is necessary to transport the mask carrier to a placement table of a lithography machine with the help of a transporting system, then the masks in the mask carrier are transferred by a transferring device into the lithography machine for performing an exposing process, and finally, the empty mask carrier is transported away by the transporting system.

At present, a lithographic apparatus is prone to poor exposure, which reduces the processing quality of the wafers.

It is to be noted that the information disclosed in the Background is only for enhancement of understanding of the background of the disclosure, and thus may include information that does not constitute the related art known to those of ordinary skill in the art.

SUMMARY

The present disclosure relates generally to the technical field of semiconductors, and more specifically to a lithographic apparatus.

According to one aspect of the present disclosure, a lithographic apparatus is provided. The lithographic apparatus may include a machine table, a base, a placement table, a first baffle plate, a first driving device, and a transporting device.

The machine table has a bottom surface, a top surface, and a side surface enclosing the bottom surface and the top surface. The side surface, the top surface, and the bottom surface may form a cavity. An openable or closable conveying door may be arranged on the side surface. A transferring device may be arranged in the cavity. The transferring device may extend out from or retract back into the cavity through the conveying door.

The base may be arranged on a side, far away from the transferring device, of the conveying door, and the base may have a bearing surface facing the top surface.

The placement table may be arranged on the bearing surface, and may at least extend out from or retract back to the bearing surface. The surface, facing away from the bearing surface, of the placement table may be configured to bear a mask carrier. The mask carrier may be configured to carry masks.

The first baffle plate may be fixed to a side, far away from the base, of the placement table, and the bearing surface may be located within an orthographic projection of the first baffle plate on the bearing surface.

The first driving device may be arranged on the placement table, and may be configured to drive the placement table to reciprocate between a first position and a second position. When the placement table is located in the first position, the placement table may be located within a boundary of the bearing surface, and when the placement table is located in the second position, the placement table may be at least partially located outside the boundary of the bearing surface.

The transporting device may be arranged on a side, far away from the base, of the machine table. When the placement table is located in the second position, the transporting device can transport the mask carrier onto the placement table. When the placement table is located in the first position, the transferring device can transfer the masks in the mask carrier into the cavity.

It is to be understood that the above general description and the following detailed description are only exemplary and explanatory, and cannot limit the present disclosure.

BRIEF DESCRIPTION OF THE DRAWINGS

The accompanying drawings here are incorporated in the disclosure and constitute a part of the disclosure, which show embodiments in accordance with present disclosure, and are used together with the specification to explain a principle of the present disclosure. It is apparent that the drawings in the following description are only some embodiments of the present disclosure, and other drawings can be obtained by those of ordinary skill in the art according to these drawings without any creative work.

DETAILED DESCRIPTION

Exemplary embodiments will now be described more comprehensively with reference to the accompanying drawings. However, the exemplary embodiments can be implemented in a variety of forms and should not be construed as being limited to the embodiments set forth herein. Instead, these embodiments are provided so that the present disclosure will be more comprehensive and complete, and the concepts of the exemplary embodiments are fully conveyed to those of ordinary skill in the art. The described features, structures, or characteristics may be combined in any suitable manner in one or more embodiments. In the following description, numerous specific details are provided for fully understanding the embodiments of the present disclosure.

The described features, structures, or characteristics may be combined in any suitable manner in one or more embodiments. In the following description, numerous specific details are provided for fully understanding the embodiments of the present disclosure. However, those skilled in the art will appreciate that the technical solution of the present disclosure may be practiced without one or more of the specific details, or other methods, components, materials, etc. may be employed. In other cases, well-known structures, materials, or operations are not shown or described in detail to avoid obscuring main technical creative ideas of the present disclosure.

Although relative terms, for example, "upper" and "lower", are used in the present specification to describe the relative relationship of one component to another component in the drawings, these terms are used in the present specification only for convenience, for example, according to the direction of the example described in the accompanying drawings. It can be understood that if the device in the drawings is overturned to turn it upside down, then the described "upper" component will become a "lower" component. Other relative terms, for example, "high", "low", "top", "bottom", "left", and "right", are also have similar meanings.

When a certain structure is "on" other structures, it possibly refers to that a certain structure is integrally formed on other structures, or a certain structure is "directly" arranged on other structures, or a certain structure is "indirectly" arranged on other structures through another structure. Terms "one", "a", and "the" are used to indicate that there is one or more elements/components or the like. Terms "include" and "have" are used to indicate the meaning of open inclusion, and mean that there may also be other elements/components or the like in addition to the listed elements/components or the like. Terms "first" and "second" are only used as markers, not as a restriction on the number of their objects.

A lithographic apparatus is provided in the embodiment of the present disclosure. As shown in FIG. 1 to FIG. 5, the lithographic apparatus may include a machine table 1, a base 2, a placement table 3, a first baffle plate 4, a first driving device 5 and a transporting device 6.

The machine table 1 may have a bottom surface 101, a top surface 102, and a side surface 103 enclosing the bottom surface 101 and the top surface 102. The side surface 103, the top surface 102 and the bottom surface 101 may form a cavity 104. An openable or closable conveying door 105 may be arranged on the side surface 103. A transferring device 106 may be arranged in the cavity 104. The transferring device 106 can extend out from or retract back into the cavity 104 through the conveying door 105.

The base 2 may be arranged on a side, far away from the transferring device 106, of the conveying door 105, and the base 2 may have a bearing surface 20 facing the top surface 102. The placement table 3 may be arranged on the bearing surface 20, and may at least extend out from or retract back to the bearing surface 20. A surface, facing away from the bearing surface 20, of the placement table 3 is configured to bear a mask carrier 100. The mask carrier 100 is configured to load masks. The first baffle plate 4 may be arranged on a side, far away from the base 2, of the placement table 3. The first baffle plate 4 may be connected to the top surface 102, and the bearing surface 20 may be located within an orthographic projection of the first baffle plate 4 on the bearing surface 20.

The first driving device 5 may be arranged on the placement table 3, and is configured to drive the placement table 3 to reciprocate between a first position and a second position. When the placement table 3 is located in the first position, the placement table 3 is located within the boundary of the bearing surface 20, and when the placement table 3 is located in the second position, the placement table 3 is at least partially located outside the boundary of the bearing surface 20.

The transporting device 6 may be arranged on a side, far away from the base 2, of the machine table 1. When the placement table 3 is located in the second position, the transporting device 6 can transport the mask carrier 100 onto the placement table 3. When the placement table 3 is located in the first position, the transferring device 106 can transfer the masks in the mask carrier 100 into the cavity 104.

In the embodiment of the present disclosure, the first baffle plate 4 is fixed on the side, far away from the base 2, of the placement table 3. That is, the first baffle plate 4 is positioned higher than the base 2 and the placement table 3. In addition, the bearing surface 20 on the base 2 is located within the orthographic projection of the first baffle plate 4 on the bearing surface 20. That is, the first baffle plate 4 can completely shield the base 2. Moreover, when the placement table 3 is located in the first position the placement table 3 is completely located below the first baffle plate 4, and meanwhile, when the placement table 3 is located in the second position, the placement table 3 is at least partially located below the first baffle plate 4.

Because the first baffle plate 4 can reduce dust particles falling to the placement table 3, accordingly less dust particles are blown from the placement table 3 to the cavity 104 of the machine table 1, which improves the situation of poor exposure of the lithographic apparatus, and further improve the processing quality of wafers.

Various components of the lithographic apparatus provided in an embodiment of the present disclosure are described in detail with reference to accompanying drawings.

Figure 1:
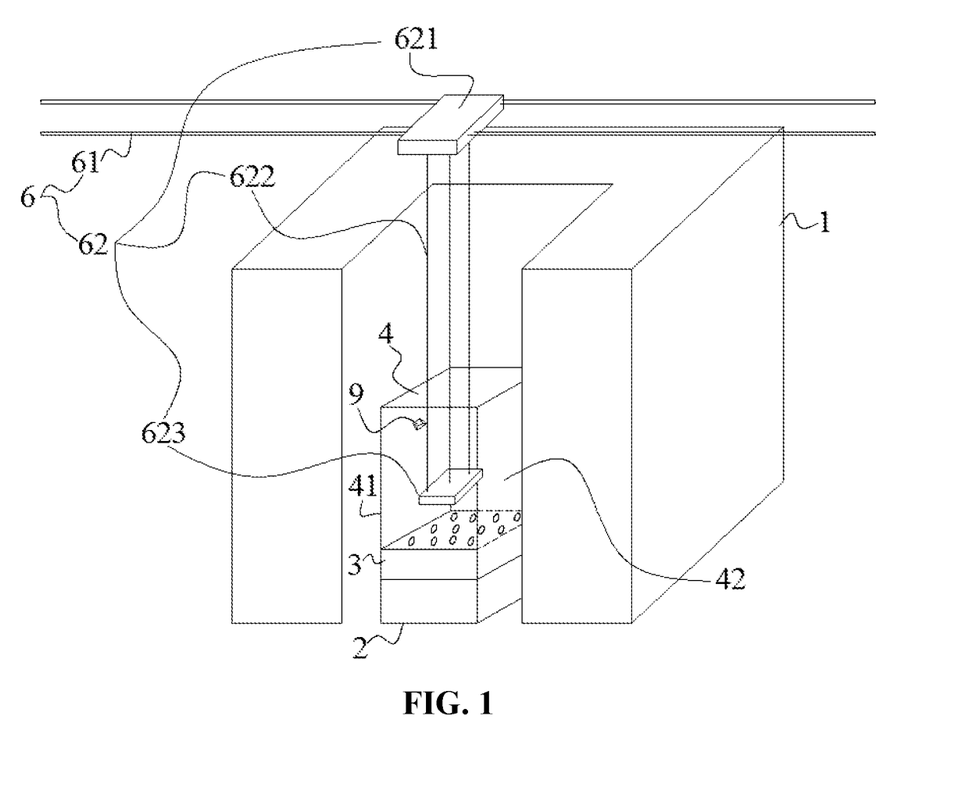
FIG. 1 is a schematic structural diagram of a lithographic apparatus of an embodiment of the present disclosure.
Figure 2:
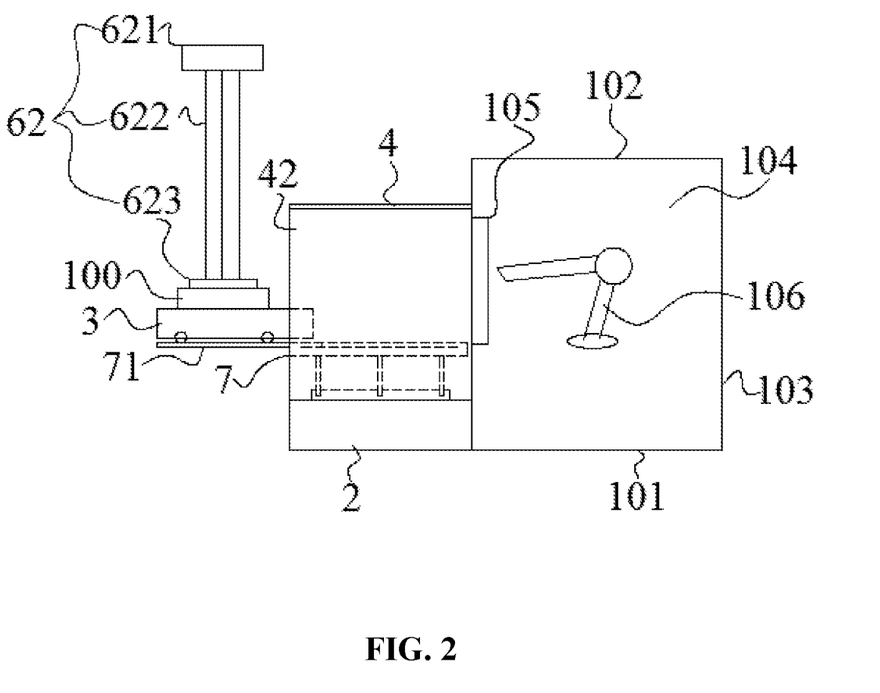
FIG. 2 is another schematic structural diagram of a lithographic apparatus of an embodiment of the present disclosure.

As shown in FIG. 1 and FIG. 2, the machine table 1 may have a bottom surface 101, a top surface 102, and a side surface 103. The top surface 102 directly faces the bottom surface 101. The side surface 103 encloses the bottom surface 101 and the top surface 102. The side surface 103, the top surface 102 and the bottom surface 101 may form a cavity 104.

For example, the machine table 1 may be a regular cube or a cube with a concave part (as shown in FIG. 1), which is not limited specially here.

Meanwhile, an openable or closable conveying door 105 may be arranged on the side surface 103. A transferring device 106 may be arranged in the cavity 104. For example, the transferring device 106 may be a mechanical arm. The mechanical arm can remove a mask from a mask carrier 100 and place it on a carrying table of the cavity 104. The mask on the carrying table will enter a process cavity to perform an exposing process, which is not described in detail here.

Figure 3:
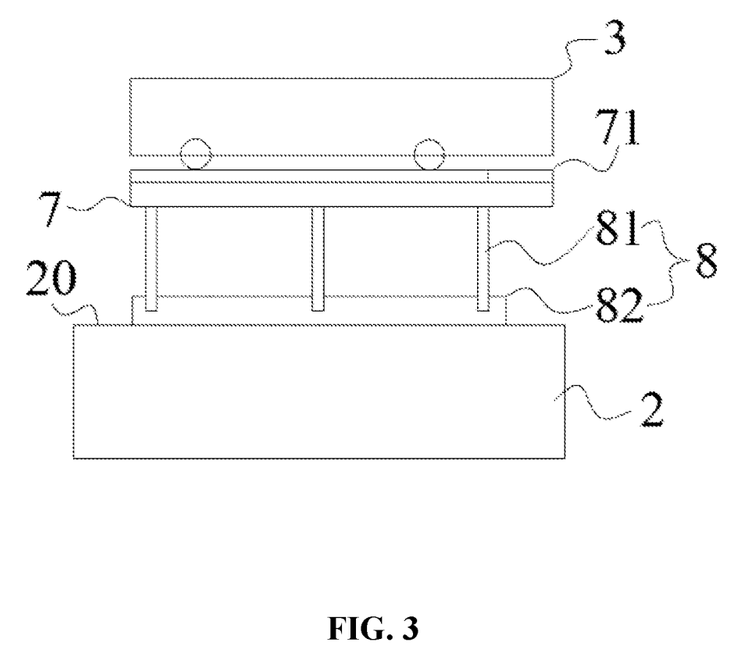
FIG. 3 is a schematic diagram of a placement table located in a first position of an embodiment of the present disclosure.

As shown in FIG. 2, the base 2 may be arranged on a side, far away from the transferring device 106, of the conveying door 105. That is, the base 2 may be arranged outside the machine table 1. Further, the base 2 may be arranged at the concave part of the machine table 1, which is not described in detail here. In addition, as shown in FIG. 3, the base 2 may have a bearing surface 20 facing the top surface 102. At this point, the placement table 3 configured to bear the mask carrier 100 may be arranged on the bearing surface 20.

As shown in FIG. 2, the first baffle plate 4 may be arranged on a side, far away from the base 2, of the placement table 3. That is, the first baffle plate 4 is positioned higher than the base 2 and the placement table 3. Specifically, the first baffle plate 4 may be connected to the top surface 102. Of course, the first baffle plate 4 may also be connected to a position below the top surface 102, which is not limited specially here.

Meanwhile, the bearing surface 20 may be located within the orthographic projection of the first baffle plate 4 on the bearing surface 20. That is, the first baffle plate 4 can completely shield the base 2. As described previously, the placement table 3 at least can extend out from or retract back to the bearing surface 20. That is, the placement table 3 may reciprocate between a first position and a second position.

Figure 4:
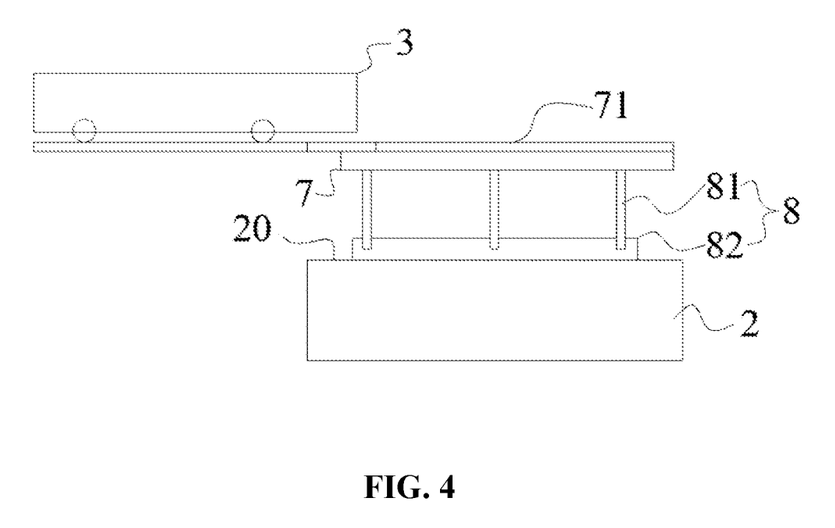
FIG. 4 is a schematic diagram of a placement table located in a second position of an embodiment of the present disclosure.

Specifically, as shown in FIG. 3, when the placement table 3 is located in the first position, the placement table 3 is located within a boundary of the bearing surface 20. That is, the placement table 3 is completely located below the first baffle plate 4. As shown in FIG. 4, when the placement table 3 is located in the second position, the placement table 3 is at least partially located outside the boundary of the bearing surface 20. That is, at least part of the placement table 3 is not located below the first baffle plate 4 any longer, so that the mask carrier 100 can fall onto the placement table 3 vertically.

Correspondingly, the lithographic apparatus of the embodiment of the present disclosure further includes a first driving device 5. The first driving device 5 may be arranged on the placement table 3, and is configured to provide a power for driving the placement table 3 to reciprocate between the first position and the second position.

In an embodiment of the present disclosure, the placement table 3 only extends out from or retracts back to the bearing surface 20. At this point, one of the placement table 3 and the bearing surface 20 may be provided with a groove. Of course, the extending direction of the groove is the same as the extending and retracting direction of the placement table 3. Correspondingly, the other one of the placement table and the bearing surface may have a protrusion slidably fitted with the groove, which is not described in detail here.

At this point, the first driving device 5 may include a driving rod and a driving cylinder. One end of the driving rod is connected to the placement table 3, and the other end of the driving rod is connected to the driving cylinder. The driving cylinder can make the driving rod extend out or retract back, so as to push the placement table 3 to reciprocate between the first position and the second position.

In another embodiment of the present disclosure, the placement table 3 not only may extend out from or retract back to the bearing surface 20 (reciprocation of the placement table 3 between the first position and the second position is equivalent to horizontal movement), but also may move up and down in the vertical direction. That is, the placement table 3 can reciprocate between the first position and the second position.

Correspondingly, a support plate 7 may be arranged between the placement table 3 and the bearing surface 20. A telescopic first railway 71 is provided on a side, close to the placement table 3, of the support plate 7. Thus, when the placement table 3 moves to the second position, the first railway 71 can extend out and hold the placement table 3.

For example, the first railway 71 may include a fixed part and a telescopic part. The fixed part may be fixedly connected to the support plate 7. The telescopic part telescopically nests inside the fixed part. Moreover, when the placement table 3 is located in the first position, the telescopic part is located in the fixed part. When the placement table 3 is located in the second position, the telescopic part extends out from the fixed part, which is not described in detail here.

Figure 5:
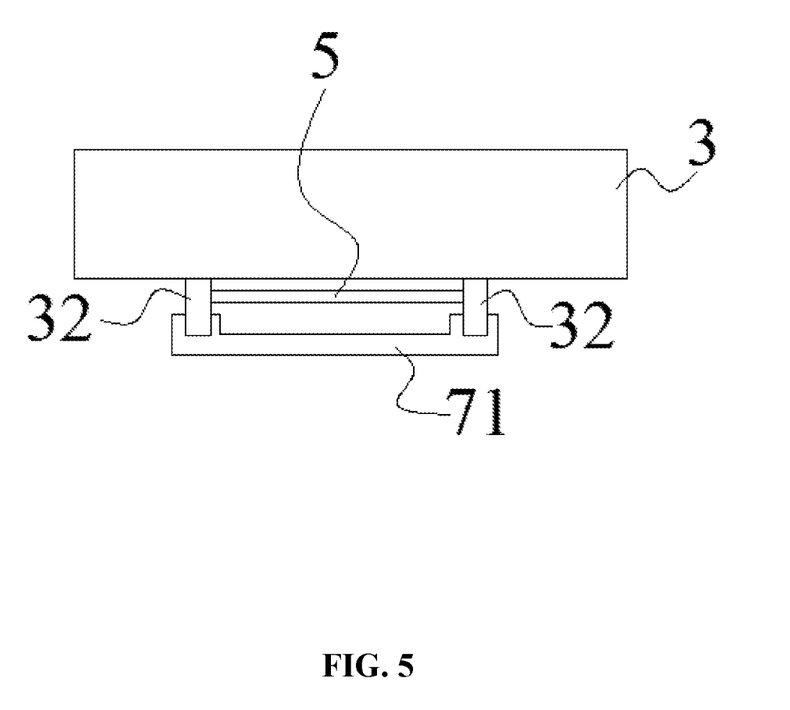
FIG. 5 is a schematic diagram of the connection among a first driving device, the placement table, and a support plate of an embodiment of the present disclosure.

As shown in FIG. 5, rollers 32 may be provided on a side, close to the support plate 7, of the placement table 3. The rollers 32 may be slidably connected to the first railway 71, so that the placement table 3 can reciprocate between the first position and the second position. For example, the first driving device 5 may be a driving electrode, and may be mounted on a wheel axle of the rollers 32, which is not described in detail here.

Figure 6:
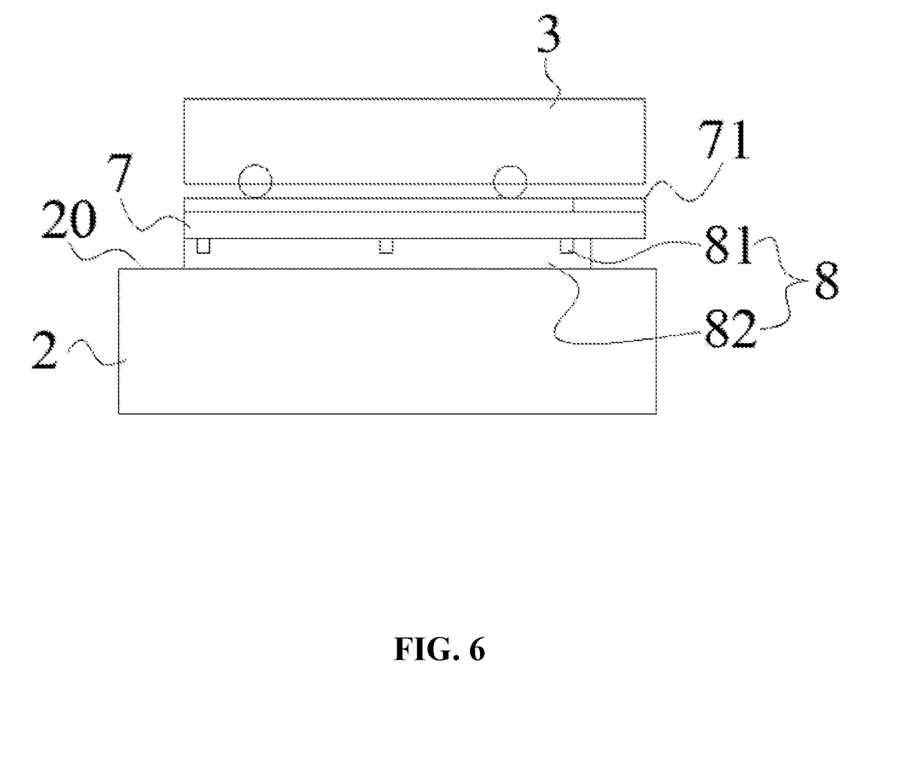
FIG. 6 is a schematic diagram of a placement table located in a third position of an embodiment of this disclosure.

As shown in FIG. 6, when the support plate 7 is located in a third position, the support plate 7 is also within the boundary of the bearing surface 20, and the third position is located on a side, close to the base 2, of the first position, that is, the third position is located right below the first position.

In addition, as shown in FIG. 3, FIG. 4 and FIG. 5, a second driving device 8 may be arranged between the support plate 7 and the base 2. For example, the second driving device 8 includes telescopic rods 81 and a driving member 82.

One end of the telescopic rod 81 may be connected to the support plate 7, and the other end of the telescopic rod 81 may be connected to the driving piece 82. The driving member 82 may be arranged on the base 2, and is configured to drive the telescopic rods 81 to stretch or shorten, so as to lift the placement table 3 from the third position to the first position (the telescopic rod 81 stretches), or to descend the first placement table 3 from the first position to the third position (the telescopic rod 81 shortens).

Figure 7:
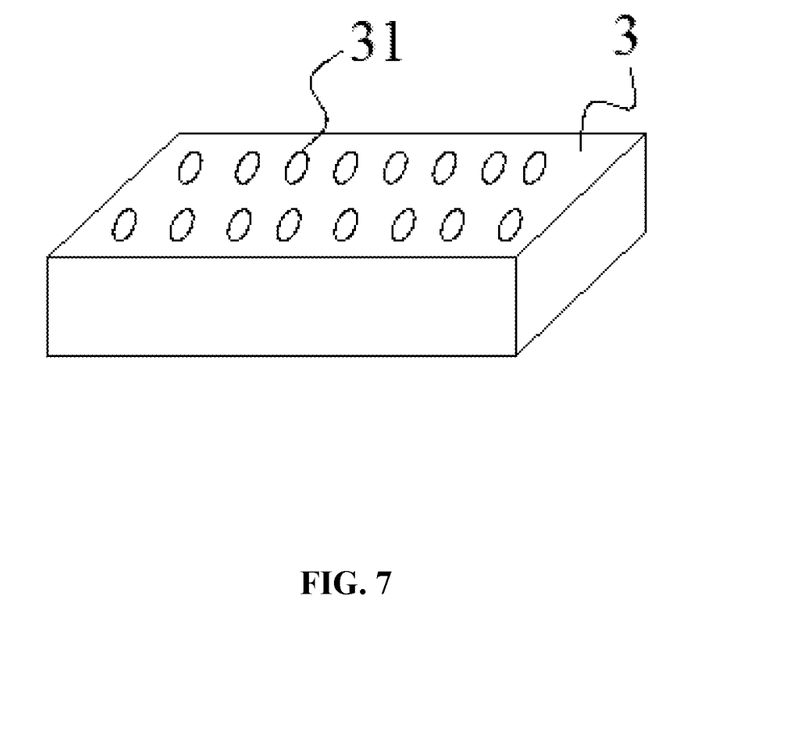
FIG. 7 is a schematic structural diagram of a placement table of an embodiment of the present disclosure.
Figure 8:
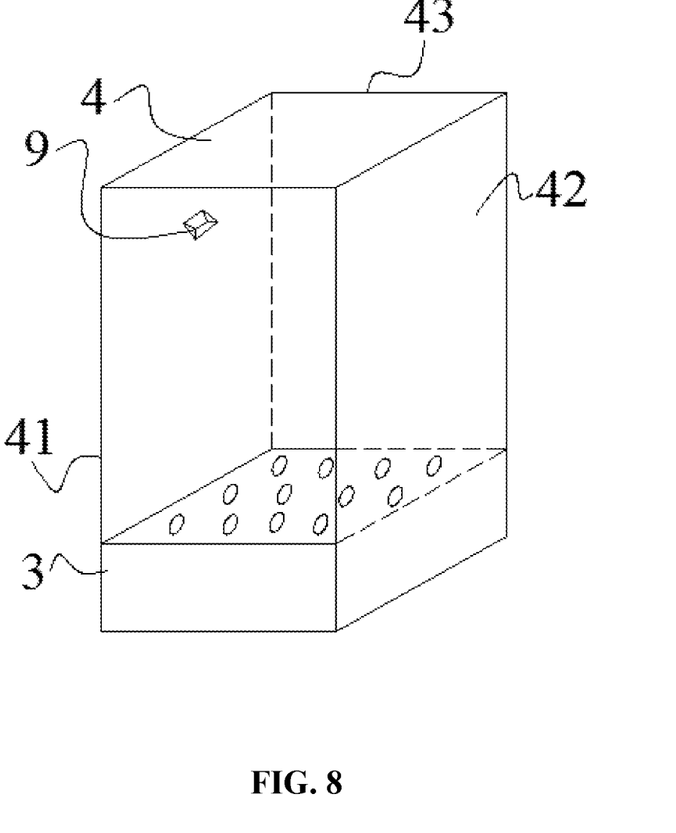
FIG. 8 is a schematic diagram of the connection among a first baffle plate, a second baffle plate, a third baffle plate, and a fourth baffle plate of an embodiment of the present disclosure.

As shown in FIG. 7, holes 31 may be formed in a surface, for bearing a mask carrier 100, of the placement table 3. The holes 31 may be disposed to penetrate through the placement table 3. Thus, dust particles on the surface of the placement table 3 may leak from the holes 31, so as to reduce the dust particles on the placement table 3, thereby reducing the dust particles blown from the placement table 3 to the cavity 104. As shown in FIG. 8, the lithographic apparatus of the embodiment of the present disclosure may further include a second baffle plate 41, a third baffle plate 42, and a fourth baffle plate 43.

The second baffle plate 41 may be connected to a side, close to the base 2, of the first baffle plate 4. The third baffle plate 42 may be connected to a side, close to the base 2, of the first baffle plate 4, and is arranged opposite to the second baffle plate 41. Of course, the second baffle plate 41 and the third baffle plate 42 are located on two sides of the conveying door 105, so that the transferring device 106 can extend to the placement table 3 through the conveying door 105, which is not described in detail here.

In addition, when the placement table 3 is located in the first position, the projection of the placement table 3 on the second baffle plate 41 is located within the second baffle plate 41. Meanwhile, the projection of the placement table 3 on the third baffle plate 42 is located within the third baffle plate 42. That is, the sizes of the second baffle plate 41 and the third baffle plate 42 are greater than the size of the placement table 3, so as to reduce the dust particles falling onto the placement table 3.

The fourth baffle plate 43 may be located between the conveying door 105 and the placement table 3, and is slidably connected to the second baffle plate 41 and the third baffle plate 42, for blocking the dust particles on the placement table 3 from blowing into the conveying door 105. Correspondingly, the lithographic apparatus of the embodiment of the present disclosure further includes a third driving device. The third driving device may be connected to the fourth baffle plate 43, and is configured to drive the fourth baffle plate 43 to reciprocate between a fourth position and a fifth position in a direction perpendicular to the bearing face 20.

For example, the third driving device may include a connecting rope, a rope winding wheel, and a driving motor.

One end of the connecting rod is connected to the fourth baffle plate 43, and the other end of the connecting rod is wound around the rope winding wheel. The rope winding wheel and the driving motor can be arranged on a side, far away from the base 2, of the fourth baffle plate 43. Meanwhile, the driving motor can be connected to the rope winding wheel, and is configured to drive the rope winding wheel to rotate around the axis thereof, so as to pull the connecting rope to drive the fourth baffle plate 43 to reciprocate in the vertical direction.

It should be noted that when the fourth baffle plate 43 is located in the fourth position, the fourth baffle plate 43 shields the conveying door 105. When the fourth baffle plate 43 is located in the fifth position, the fourth baffle plate 43 and the conveying door 105 are staggered, so that the transferring device 106 can reach to the placement table 3 through the conveying door 105.

Figure 9:
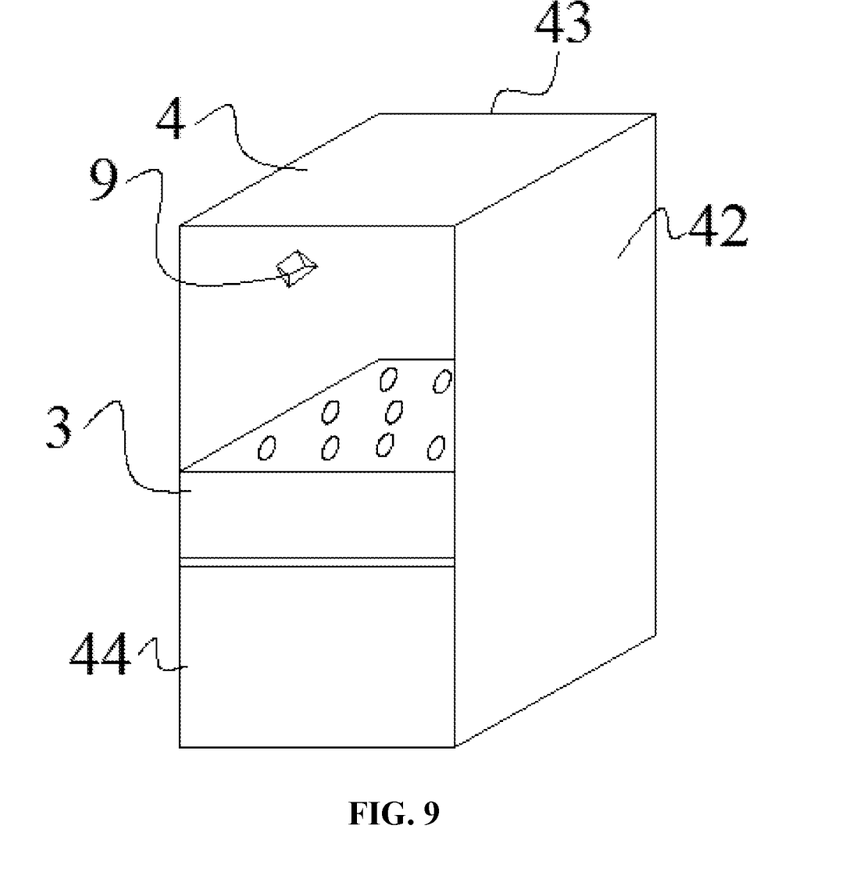
FIG. 9 is a schematic diagram of a fifth baffle plate of an embodiment of the present disclosure.

In addition, as shown in FIG. 9, the lithographic apparatus of the embodiment of the present disclosure further includes a fifth baffle plate 44. The fifth baffle plate 44 may be arranged on a side, far away from the fourth baffle plate 43, of the second baffle plate 41 and the third baffle plate 42, so that the second baffle plate 41, the third baffle plate 42, the fourth baffle plate 43, and the fifth baffle plate 44 may define a box enclosed by them.

Of course, there is a gap on a side, far away from the fourth baffle plate 43, of the box. The size of the gap is greater than the size of the placement table 3, so that the placement table 3 can move from the first position to the second position through the gap, which is not described in detail here.

As shown in FIG. 1 and FIG. 2, the transferring device 6 may be arranged on a side, far away from the base 2, of the machine table 1. That is, the transferring device 6 is positioned higher than the machine table 1, so that when the placement table 3 is located in the second position, the transporting device 6 can transport the mask carrier 100 to or away from the placement table 3.

For example, the transporting device 6 may include a second railway 61 and a overhead crane 62.

The second railway 61 may be arranged on a side, far away from the base 2, of the machine table 1. That is, the second railway 61 is arranged higher than the machine table 1. The overhead crane 62 is slidably connected to the second railway 61, and is configured to transport the mask carrier 100.

The overhead crane 62 may include a suspension vehicle 621, a connecting cable 622, and an adsorption plate 623. The suspension vehicle 621 is slidably connected to the second railway 61. One end of the connecting cable 622 may be connected to the suspension vehicle 621, and the other end of the connecting cable 622 may be connected to the adsorption plate 623. Of course, the suspension vehicle 621 can retract or extend the connecting cable 622, and the adsorption plate 623 can suck up and put down the mask carrier 100, which is not described in detail here.

As shown in FIG. 8, the lithographic apparatus of the embodiment of the present disclosure may further include a gas blowing device 9. The gas blowing device 9 is configured to blow gas to the placement table 3, so as to blow away the dust particles falling onto the placement table 3 from the holes 31.

For example, the gas blowing device 9 may also be a fan. The fan may be arranged on a side, close to the third baffle plate 42, of the second baffle plate 41, or a side, close to the second baffle plate 41, of the third baffle plate 42, which is not limited specially here.

Of course, the gas blowing device 9 may also include a gas collection container, a connecting pipe, and a nozzle. The gas collection container may be arranged outside a space enclosed by the second baffle plate 41, the third baffle plate 42, and the fourth baffle plate 43. One end of the connecting pipe may be communicated with the gas collection container and the other end of the connecting pipe may be communicated with the nozzle, thereby leading gas in the gas collection container to the nozzle. The nozzle may be arranged on a side, close to the third baffle plate 42, of the second baffle plate 41, or a side, close to the second baffle plate 41, of the third baffle plate 42, and faces the placement table 3, to blow gas to the placement table 3.

In addition, the lithographic apparatus of the embodiment of the present disclosure can further include a control unit. The control unit may be a computer, a single chip microcomputer, or the like, and may be connected to the conveying door 105, the transferring device 106, the first driving device 5, the transporting device 6, the second driving device 8, the third driving deice, and the gas blowing device 9, to automatically control various devices to operate collaboratively.

Figure 10:
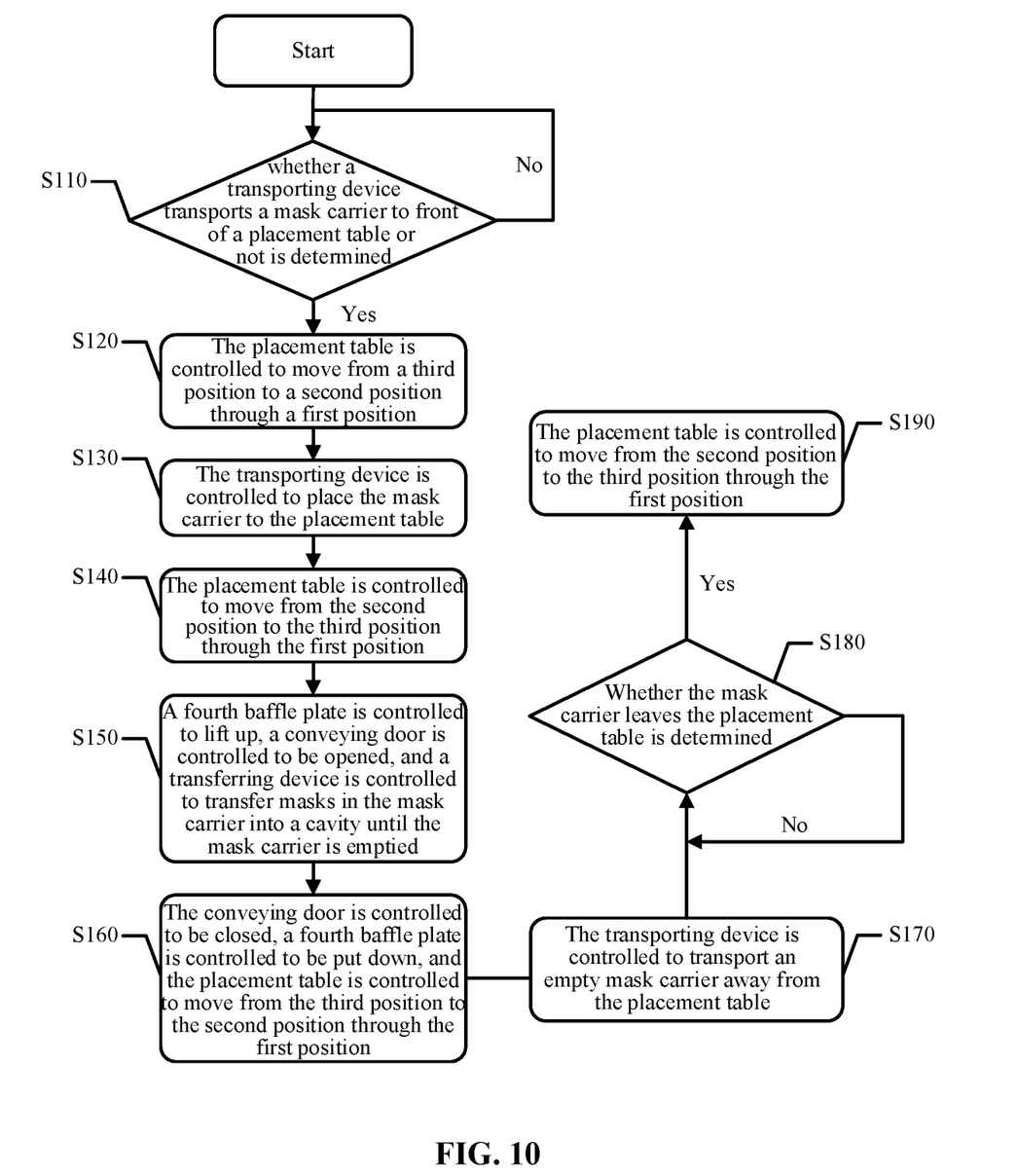
FIG. 10 is a flowchart of a control method of a lithographic apparatus of an implementation mode of the present disclosure.

Correspondingly, a control method of the lithographic apparatus is further provided in the embodiment of the present disclosure. As shown in FIG. 10, the control method may include the following steps.

S110, whether a transporting device 6 transports a mask carrier 100 to front of a placement table 3 or not is determined.

S120, when the transporting device 6 transports the mask carrier 100 to front of the placement table 3, a second driving device 8 is controlled to drive the placement table 3 from a third position to a first position, and a first driving device 5 is controlled to drive the placement table 3 from the first position to a second position.

S130, the transporting device 6 is controlled to place the mask carrier 100 to the placement table 3.

S140, the first driving device 5 is controlled to drive the placement table 3 from the second position to the first position, and the second driving device 8 is controlled to drive the placement table 3 from the first position to the third position.

S150, a third driving device is controlled to lift the fourth baffle plate 43, a conveying door 105 is controlled to be opened, and a transferring device 106 is controlled to transfer masks (not shown in the drawings) in the mask carrier 100 to a cavity 104 until the mask carrier 100 is emptied.

S160, the conveying door 105 is controlled to be closed, and the third driving device is controlled to put down the fourth baffle plate 43. The second driving device 8 is controlled to drive the placement table 3 from the third position to the first position, and the first driving device 5 is controlled to drive the placement table 3 from the first position to the second position.

S170, the transporting device 6 is controlled to transport the empty mask carrier 100 away from the placement table 3.

S180, whether the mask carrier 100 leaves the placement table 3 is determined.

S190, after the mask carrier 100 leaves the placement table 3, the first driving device 5 is controlled to drive the placement table 3 from the second position to the first position, and the second driving device 8 is controlled to drive the placement table 3 from the first position to the third position.

It should be understood that the present disclosure does not limit its application to detailed structures and arrangement manners of the components proposed in the present specification. The present disclosure can have other embodiments, and can be implemented and executed in a variety of forms. The deformation forms and modification forms of previously described features fall within the scope of the present disclosure. It may be understood that the present disclosure disclosed and limited by the present specification extend to all alternative combinations of two or more separate features mentioned or apparent in the text and/or the accompanying drawings. All these different combinations constitute a plurality of alternative aspects of the present disclosure. The embodiments described in the present specification illustrate the best-known ways used to implement the present disclosure, and will enable those skilled in the art to utilize the present disclosure.

What is claimed is:

1. A lithographic apparatus, comprising:
    a machine table, having a bottom surface, a top surface, and a side surface enclosing the bottom surface and the top surface, the side surface, the top surface and the bottom surface forming a cavity, wherein an openable or closable conveying door is arranged on the side surface, and a transferring device is arranged in the cavity, the transferring device being capable of extending out from or retracting back into the cavity through the conveying door;
    a base, arranged on a side, far away from the transferring device, of the conveying door, the base having a bearing surface facing the top surface;
    a placement table, arranged on the bearing surface and being capable of at least extending out from or retracting back to the bearing surface, wherein a surface, facing away from the bearing surface, of the placement table is configured to bear a mask carrier, and the mask carrier is configured to carry masks;
    a first baffle plate, fixed to a side, far away from the base, of the placement table, wherein the bearing surface is located within a orthographic projection of the first baffle plate on the bearing surface;
    a first driving device, arranged at the placement table and configured to drive the placement table to reciprocate between a first position and a second position, wherein when the placement table is located in the first position, the placement table is located within a boundary of the bearing surface, and when the placement table is located in the second position, the placement table is at least partially located outside the boundary of the bearing surface; and
    a transporting device, arranged on a side, far away from the base, of the machine table, wherein when the placement table is located in the second position, the transporting device is capable of transporting the mask carrier to the placement table, and when the placement table is located in the first position, the transferring device is capable of transferring the masks in the mask carrier into the cavity.

2. The lithographic apparatus of claim 1, wherein a support plate is arranged between the placement table and the bearing surface, a telescopic first railway is arranged on a side, close to the placement table, of the support plate, and rollers are arranged on a side, close to the support plate, of the placement table, the rollers being slidably connected to the first railway; and wherein the first driving device is mounted on the rollers, and is configured to drive the placement table to reciprocate between the first position and the second position.

3. The lithographic apparatus of claim 2, further comprising:
    a second driving device, the second driving device being arranged on the base, and being connected to the support plate, to drive the support plate to reciprocate between the first position and the second position,
    wherein when the support plate is located in a third position, the support plate is located within the boundary of the bearing surface, and the third position is located on a side, close to the base, of the first position.

4. The lithographic apparatus of claim 3, wherein the second driving device comprises telescopic rods and a driving member; an end of the telescopic rod is connected to the support plate, and another end of the telescopic rod is connected to the driving piece; the driving member is arranged on the base, and is configured to drive the telescopic rods to drive the support plate to reciprocate between the first position and the third position.

5. The lithographic apparatus of claim 1, further comprising:
    a second baffle plate, connected to a side, close to the base, of the first baffle plate;
    a third baffle plate, connected to a side, close to the base, of the first baffle plate and arranged opposite to the second baffle plate, and the second baffle plate and the third baffle plate being located on two sides of the conveying door,
    wherein when the placement table is located in the first position, a projection of the placement table on the second baffle plate is located within the second baffle plate, and a projection of the placement table on the third baffle plate is located within the third baffle plate.

6. The lithographic apparatus of claim 5, further comprising:
    a fourth baffle plate, slidably connected to the second baffle plate and the third baffle plate, and located between the conveying door and the placement table;
    a third driving device, arranged at the first baffle plate, and connected to the fourth baffle plate, to drive the fourth baffle plate to reciprocate between a fourth position and a fifth position in a direction perpendicular to the bearing surface,
    wherein when the fourth baffle plate is located in the fourth position, the fourth baffle plate shields the conveying door; and when the fourth baffle plate is located in the fifth position, the fourth baffle plate and the conveying door are staggered and the transferring device is able to reach to the placement table through the conveying door.

7. The lithographic apparatus of claim 5, further comprising:
    a gas blowing device, arranged on a side, close to the third baffle plate, of the second baffle plate, and facing the placement table, to blow gas to the placement table.

8. The lithographic apparatus of claim 7, wherein holes are formed in the surface, configured to bear the mask carrier, of the placement table, and the holes are disposed in a manner of penetrating through the placement table.

9. The device of claim 1, wherein the transporting device comprises:
- a second railway, arranged on a side, far away from the base, of the placement table;
- an overhead crane, slidably connected to the second railway; wherein when the placement table is located in the second position, the overhead crane is able to slide to a position right above the placement table, to transport the mask carrier to or away from the placement table.

10. The lithographic apparatus of claim 9, wherein the overhead crane comprises a suspension vehicle, a connecting cable, and an adsorption plate,
- wherein the suspension vehicle is slidably connected to the second railway; an end of the connecting cable is connected to the suspension vehicle, the suspension vehicle being configured to retract or extend the connecting cable; another end of the connecting cable is connected to the adsorption plate, the adsorption plate being configured to suck up and put down the mask carrier; and when the placement table is located in the second position, the suspension vehicle, the connecting cable, and the adsorption plate are able to slide to a position right above the placement table.

11. The lithographic apparatus of claim 7, wherein the gas blowing device is a fan.

12. The lithographic apparatus of claim 7, wherein the gas blowing device comprises a gas collection container, a connecting pipe and a nozzle.

13. The lithographic apparatus of claim 12, wherein the gas collection container is arranged outside a space enclosed by the second baffle plate, the third baffle plate and a fourth baffle plate, the fourth baffle plate being slidably connected to the second baffle plate and the third baffle plate and being located between the conveying door and the placement table.

14. The lithographic apparatus of claim 12, wherein an end of the connecting pipe is communicated with the gas collection container and another end of the connecting pipe is communicated with the nozzle.

15. The lithographic apparatus of claim 12, wherein the nozzle is arranged on a side, close to the third baffle plate, of the second baffle plate, and faces the placement table.

16. The lithographic apparatus of claim 12, wherein the nozzle is arranged o on a side, close to the second baffle plate, of the third baffle plate, and faces the placement table.

* * * * *